US012757683B2

(12) United States Patent
Inui et al.

(10) Patent No.: US 12,757,683 B2
(45) Date of Patent: Oct. 6, 2026

(54) ELECTROSTATIC CHUCK HAVING A DIELECTRIC SUBSTRATE AND METHOD OF MANUFACTURING

(71) Applicant: SUMITOMO OSAKA CEMENT CO., LTD., Tokyo (JP)

(72) Inventors: Satoyoshi Inui, Tokyo (JP); Taku Ichiyoshi, Tokyo (JP); Takeshi Otsuka, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 179 days.

(21) Appl. No.: 18/721,088

(22) PCT Filed: Dec. 9, 2022

(86) PCT No.: PCT/JP2022/045561
§ 371 (c)(1),
(2) Date: Jun. 17, 2024

(87) PCT Pub. No.: WO2023/120258
PCT Pub. Date: Jun. 29, 2023

(65) Prior Publication Data
US 2025/0069931 A1 Feb. 27, 2025

(30) Foreign Application Priority Data
Dec. 24, 2021 (JP) ................................ 2021-210440

(51) Int. Cl.
*H10P 72/72* (2026.01)

(52) U.S. Cl.
CPC ................................ *H10P 72/722* (2026.01)

(58) Field of Classification Search
CPC .... H10P 72/722; H10P 72/0434; H10P 72/70; H10P 72/72; H10P 72/7616; C04B 37/00;
(Continued)

(56) References Cited

U.S. PATENT DOCUMENTS 6,723,274 B1 * 4/2004 Divakar ................ C04B 35/581 264/618
2002/0135969 A1 * 9/2002 Weldon ............... C23C 16/4586 361/234
(Continued)

FOREIGN PATENT DOCUMENTS

JP 2013012616 A * 1/2013
JP 2013-074251 A 4/2013
(Continued)

OTHER PUBLICATIONS

International Search Report for PCT/JP2022/045561 (Feb. 21, 2023).

*Primary Examiner* — Sreeya Sreevatsa
(74) *Attorney, Agent, or Firm* — Merchant & Gould P.C.

(57) ABSTRACT

Provided is an electrostatic chuck member including: a dielectric substrate having a placement surface on which a sample is mounted, wherein the dielectric substrate comprises a first supporting plate and a second supporting plate which are stacked in a thickness direction thereof; and an adsorption electrode embedded in the dielectric substrate, in which a gas flow path is provided by a recessed groove, which is provided between the first supporting plate and the second supporting plate which have surfaces facing each other, wherein the recessed groove is formed in at least one of the surfaces thereof and is covered with the other thereof, a dimension of the gas flow path in a height direction is 90 μm or more and 300 μm or less, and a width dimension of the gas flow path is 500 μm or more and less than 3000 μm.

20 Claims, 6 Drawing Sheets

(58) Field of Classification Search
CPC .......... C04B 35/117; C04B 2235/3826; H02N 13/00; H01J 37/32724
USPC .......................................................... 361/234
See application file for complete search history.

(56) References Cited

U.S. PATENT DOCUMENTS

| | | | | |
|---|---|---|---|---|
| 2019/0013231 | A1* | 1/2019 | Yamaguchi | B23Q 3/15 |
| 2021/0272834 | A1* | 9/2021 | Takayama | B32B 18/00 |

FOREIGN PATENT DOCUMENTS

| | | | | |
|---|---|---|---|---|
| JP | 2014165405 | A | * | 9/2014 |
| JP | 5936165 | B | | 6/2016 |
| JP | 2016-207931 | A | | 12/2016 |
| JP | 2017123396 | A | * | 7/2017 |
| JP | 2017-208527 | A | | 11/2017 |
| JP | 2021-141116 | A | | 9/2021 |

* cited by examiner

ELECTROSTATIC CHUCK HAVING A DIELECTRIC SUBSTRATE AND METHOD OF MANUFACTURING

TECHNICAL FIELD

The present invention relates to an electrostatic chuck member, an electrostatic chuck device, and a method for manufacturing the electrostatic chuck member.

This application is a National Stage Application of PCT/JP2022/045561, filed on Dec. 9, 2022, which claims priority to Japanese Patent Application No. 2021-210440, filed on Dec. 24, 2021, and which applications are incorporated herein by reference. To the extent appropriate, a claim of priority is made to each of the above disclosed applications.

BACKGROUND ART

In a semiconductor manufacturing process, an electrostatic chuck device that holds a semiconductor wafer in a vacuum environment is used. In the electrostatic chuck device, a plate-shaped sample such as a semiconductor wafer is placed on a placement surface, and an electrostatic force is generated between the plate-shaped sample and an internal electrode to adsorb and fix the plate-shaped sample. In the electrostatic chuck device, a gas flow path for cooling the plate-shaped sample may be provided in a dielectric substrate on which a placement surface is formed. Patent Literature No. 1 discloses a configuration in which a flow path is formed in a slurry layer disposed between two ceramic plates in an electrostatic chuck in which the two ceramic plates are stacked. Patent Literature No. 2 discloses a configuration in which, in an electrostatic chuck device that is formed by stacking green sheets, a flow path is formed by performing machining such as punching or grinding on the green sheets.

CITATION LIST

Patent Literature

[Patent Literature No. 1] Japanese Laid-open Patent Publication No. 2021-141116
[Patent Literature No. 2] Japanese Patent No. 5936165

SUMMARY OF INVENTION

Technical Problem

When the height dimension of a gas flow path is excessively large, the gas flow path functions as a heat insulating layer, which causes non-uniformity of the temperature of the placement surface. In the electrostatic chuck of Patent Literature No. 1, a gas flow path having a size of 30 μm or less is formed. However, the slurry layer needs to be calcinated at a relatively low temperature of 1200° C. to 1700° C., and there is a problem in that voltage endurance of the slurry layer is insufficient. The electrostatic chuck of Patent Literature No. 2 is formed by calcinating the green sheets, and thus it is difficult to sufficiently reduce the height dimension of the gas flow path due to shrinkage occurring during the calcination.

An object of the present invention is to provide an electrostatic chuck member where a height dimension of a gas flow path is suppressed, an electrostatic chuck device, and a method for manufacturing the electrostatic chuck member.

Solution to Problem

A first aspect of the present invention provides the following electrostatic chuck member.

The electrostatic chuck member according to the first aspect of the present invention includes: a dielectric substrate having a placement surface on which a sample is mounted, wherein the dielectric substrate comprises a first supporting plate and a second supporting plate which are stacked in a thickness direction thereof; and an adsorption electrode which is embedded in the dielectric substrate, in which a gas flow path is provided with a recessed groove, which is provided between the first supporting plate and the second supporting plate which have surfaces facing each other, wherein the recessed groove is formed in at least one of the surfaces thereof and is covered with the other thereof, a dimension of the gas flow path in a height direction is 90 μm or more and 300 μm or less, and a width dimension of the gas flow path is 500 μm or more and less than 3000 μm.

The sample refers to a substance that can be mounted on the placement surface of the electrostatic chuck device and can be electrostatically chucked. The sample may be a wafer, a plate-shaped sample, or a plate.

It is preferable that the first aspect of the present invention has the following characteristics. It is also preferable to combine two or more of these characteristics.

In the above-described electrostatic chuck member, the dielectric substrate may be a composite sintered body of aluminum oxide and silicon carbide.

In the above-described electrostatic chuck member, an average primary particle diameter of an insulating material forming the dielectric substrate may be 1.6 μm or more and 10.0 μm or less.

In the above-described electrostatic chuck member, the first supporting plate and the second supporting plate may be joined to each other through a joining layer, and a height dimension of the gas flow path may be a sum of a thickness dimension of the joining layer and a depth dimension of the recessed groove. The thickness dimension of the joining layer is preferably 5 μm or more and 30 μm or less and more preferably 7 μm or more and 20 μm or less.

In the above-described electrostatic chuck member, the adsorption electrode may be disposed between the first supporting plate and the second supporting plate and may be exposed to the gas flow path.

A second aspect of the present invention provides the following electrostatic chuck device.

The electrostatic chuck device according to the aspect of the present invention includes: the above-described electrostatic chuck member; and a base that supports the electrostatic chuck member from a side opposite to the placement surface.

A third aspect of the present invention provides the following method for manufacturing an electrostatic chuck member.

A method for manufacturing an electrostatic chuck member according to the third aspect of the present invention is a method for manufacturing an electrostatic chuck member which includes a dielectric substrate, which includes a first supporting plate, a second supporting plate, and a joining layer disposed between the first supporting plate and the second supporting plate, and an adsorption electrode that is embedded in the dielectric substrate, the method including: a recessed groove forming step of forming a recessed groove in the first supporting plate; an application step of applying a joining layer paste to at least one of the first supporting plate and the second supporting plate; and a joining step of stacking the first supporting plate and the second supporting plate in a thickness direction thereof through the joining layer paste, and joining the first supporting plate and the second supporting plate by heating and pressurizing them, in which a heat treatment temperature in the joining step is 1700° C. or higher.

It is preferable that the third aspect of the present invention has the following characteristics. It is also preferable to combine two or more of these characteristics.

In the joining step, a surface of the first supporting plate where the recessed groove is formed and a surface of the second supporting plate may be joined to each other through the joining layer paste, the recessed groove may have an arc shape in a plan view, and the recessed groove may include an inner peripheral side surface portion disposed on an arc inner peripheral side, an outer peripheral side surface portion disposed on an arc outer peripheral side, and a bottom surface portion connecting the side surface portions, wherein the side surface portions, which face each other, may be inclined with respect to the thickness direction of the supporting plates.

A material which is used to form the first supporting plate, the second supporting plate, and the third supporting plate may be an aluminum oxide-silicon carbide composite sintered body.

The recessed groove forming step may be performed by blasting or rotary processing.

Advantageous Effects of Invention

According to one aspect of the present invention, it is possible to provide an electrostatic chuck member where a height dimension of a gas flow path is suppressed, an electrostatic chuck device, and a method for manufacturing an electrostatic chuck member.

DESCRIPTION OF EMBODIMENTS

A preferable example of each of embodiments of an electrostatic chuck device according to the present invention will be described below with reference to the drawings. In all of the following drawings, dimensions, ratios, and the like of respective components may be appropriately different from the actual ones in order to easily understand the drawings. In addition, the following description is made for better understanding of the scope of the invention, and does not limit the present invention unless otherwise specified. Within a range not departing from the present invention, changes, omissions, or additions can be made for a number, an amount, a position, a size, a numerical value, a ratio, an order, a kind, a shape, or the like.

In addition, each of the drawings illustrates a Z-axis. In the present specification, the Z-axis is a direction orthogonal to a placement surface as necessary. In addition, an upper surface that is a direction in which the placement surface faces is defined as a +Z direction.

Figure 1:
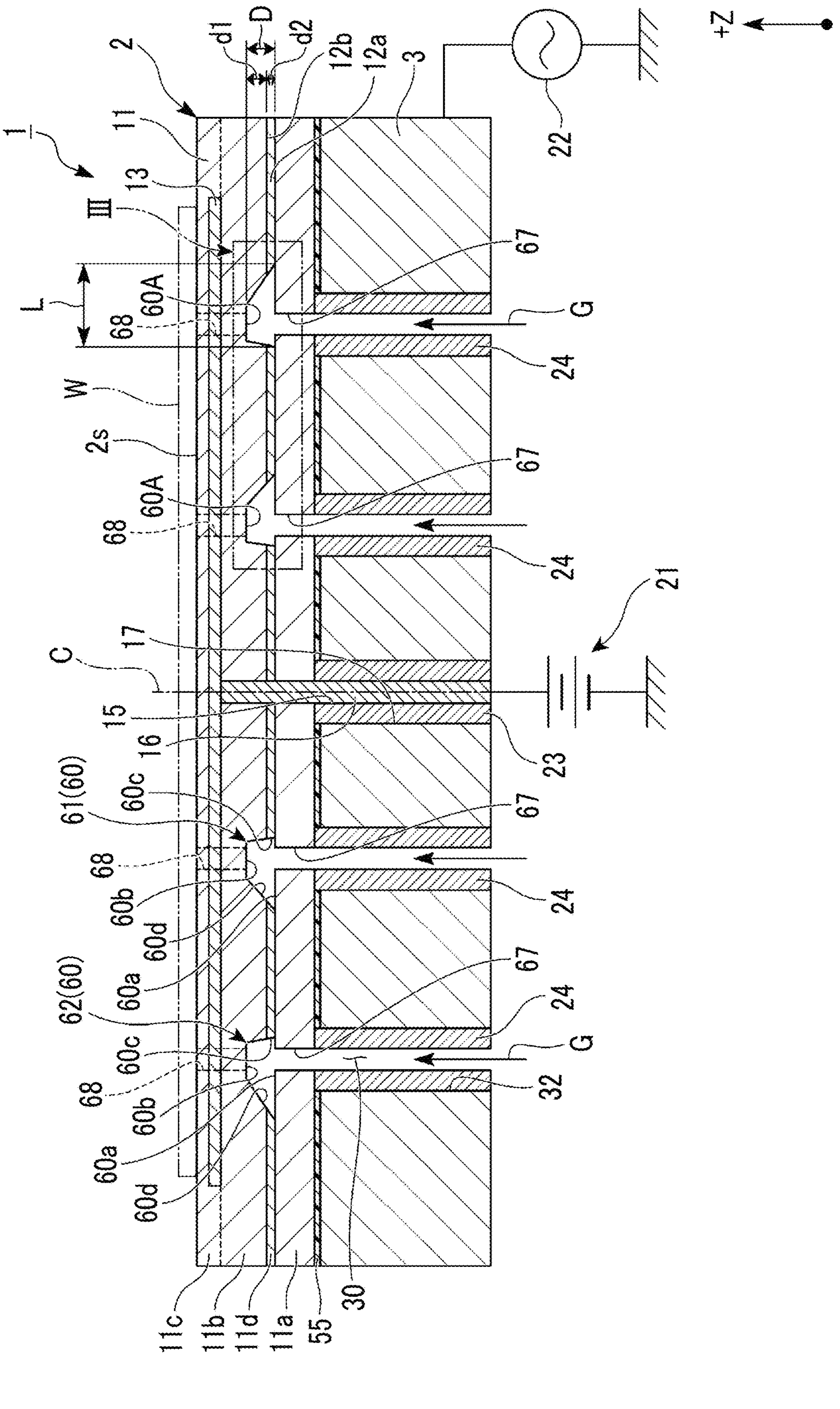
FIG. 1 is a schematic cross-sectional view illustrating a preferable example of an electrostatic chuck device 1 according to an embodiment of the present invention.

FIG. 1 is a schematic cross-sectional view showing an electrostatic chuck device 1 according to the present embodiment.

The electrostatic chuck device 1 includes: an electrostatic chuck member 2 having a placement surface 2*s* on which a wafer (sample) W is mounted includes: a base 3 that supports the electrostatic chuck member 2 from a side opposite to the placement surface 2*s*; and a feeding terminal 16 that applies a voltage to the electrostatic chuck member 2. A focus ring surrounding the wafer W may be disposed on an outer peripheral portion of an upper surface of the electrostatic chuck member 2. Any shape, any size, or any material of the wafer W can be selected, and the wafer W is preferably a circular plate.

The electrostatic chuck member 2 has a disk shape around a central axis C. The electrostatic chuck member 2 includes a dielectric substrate 11 and an adsorption electrode 13 embedded in the dielectric substrate 11. The electrostatic chuck member 2 adsorbs the wafer W using the placement surface 2*s* provided in the dielectric substrate 11.

In the following description, in each of the portions of the electrostatic chuck device 1, a side on which the wafer W is mounted on the electrostatic chuck member 2 is described as an upper side, and a base 3 side is described as a lower side. In addition, in the electrostatic chuck member 2, an up-down direction (Z-axis direction) is described as a thickness direction. That is, in the electrostatic chuck member 2 and the dielectric substrate 11, a direction orthogonal to the placement surface is described as the thickness direction.

The up-down direction described herein is merely a direction used for simplifying the description, and does not limit a position when the electrostatic chuck device 1 is used.

The dielectric substrate 11 has a circular plate shape in a plan view. In the dielectric substrate 11, the placement surface 2*s* on which the wafer W is mounted is provided. In the placement surface 2*s*, for example, a plurality of protrusion portions (not illustrated) may be formed at predetermined intervals. The placement surface 2*s* supports the wafer W at tip portions of the plurality of protrusion portions.

The dielectric substrate 11 includes a first supporting plate 11*a*, a second supporting plate 11*b*, a third supporting plate 11*c*, and a joining layer 11*d*. The first supporting plate 11*a*, the second supporting plate 11*b*, the third supporting plate 11*c* have a plate shape extending along the placement surface 2*s*. The first supporting plate 11*a*, the second supporting plate 11*b*, and the third supporting plate 11*c* are stacked in this order from the lower side toward the upper side in the thickness direction. In addition, the joining layer 11*d* is disposed between the first supporting plate 11*a* and the second supporting plate 11*b*. The first supporting plate 11*a* and the second supporting plate 11*b* are joined to each other through the joining layer 11*d*. The joining layer 11*d* may also be provided between the second supporting plate 11*b* and the third supporting plate 11*c*. Further, the dielectric substrate 11 does not need to include the joining layer 11*d*. In this case, the first supporting plate 11*a* and the second supporting plate 11*b* are directly joined to each other.

The first supporting plate 11*a*, the second supporting plate 11*b*, the third supporting plate 11*c*, and the joining layer 11*d* forming the dielectric substrate 11 are formed of a composite sintered body having a sufficient mechanical strength and durability against corrosive gas and plasma thereof. As a dielectric material forming the dielectric substrate 11, a ceramic having a mechanical strength and durability against corrosive gas and plasma thereof is suitably used. As the ceramic forming the dielectric substrate 11, for example, an aluminum oxide ($Al_2O_3$) sintered body, an aluminum nitride (AlN) sintered body, or an aluminum oxide ($Al_2O_3$)-silicon carbide (SiC) composite sintered body is suitably used.

In particular, from the viewpoints of dielectric characteristics, high corrosion resistance, plasma resistance, and heat resistance at a high temperature, the dielectric substrate 11 is preferably an aluminum oxide ($Al_2O_3$)-silicon carbide (SiC) composite sintered body. In addition, as described below, the dielectric substrate 11 is formed by joining the plurality of supporting plates 11*a* and 11*b* to each other through the joining layer 11*d*. Since the dielectric substrate 11 is a composite sintered body of aluminum oxide and silicon carbide, a joining temperature of the supporting plates is likely to be high. As a result, the particle diameter of the aluminum oxide as an insulating material was increased, and voltage endurance can be improved. That is, when the dielectric substrate 11 is a composite sintered body of aluminum oxide and silicon carbide, the voltage endurance is likely to be improved.

In the present embodiment, a configuration of a compound material in the material forming the joining layer 11*d* may be different from a configuration of a compound material forming the first supporting plate 11*a* and the second supporting plate 11*b*. As described below, it is preferable that a thermal conductivity of the material forming the joining layer 11*d* is higher than thermal conductivities of the first supporting plate 11*a* and the second supporting plate 11*b*. For example, when the first supporting plate 11*a*, the second supporting plate 11*b*, and the joining layer 11*d* are formed of the same material (for example, an aluminum oxide-silicon carbide composite sintered body), the thermal conductivity of the joining layer 11*d* can be increased by increasing a ratio of a conductive material (for example, silicon carbide) in the joining layer 11*d* to be higher than a ratio of a conductive material in the first supporting plate 11*a* and the second supporting plate 11*b*.

An average primary particle diameter of an insulating material (for example, aluminum oxide) forming the first supporting plate 11*a*, the second supporting plate 11*b*, the third supporting plate 11*c*, and the joining layer 11*d* of the dielectric substrate 11 is preferably 0.5 μm or more and 10.0 μm or less, and more preferably 1.6 μm or more and 6.0 μm or less. The average primary particle diameter of the insulating material may be 1.0 μm or more and 8.0 μm or less, 2.0 μm or more and 7.0 μm or less, 2.5 μm or more and 5.0 μm or less, 2.8 μm or more and 4.0 μm or less, or the like.

When the average primary particle diameter of the insulating material forming the dielectric substrate 11 is 0.5 μm or more, sufficient voltage endurance can be obtained. On the other hand, when the average primary particle diameter of the insulating material forming the dielectric substrate 11 is 10.0 μm or less (more preferably 6.0 μm or less), workability of grinding or the like is excellent, and a recessed groove described below can be easily formed. Further, by setting the average primary particle diameter of the insulating material to 10.0 μm or less, a heat exchange efficiency of the dielectric substrate 11 with heat transfer gas G in a gas flow path 60 described below can be sufficiently ensured.

A method for measuring the average primary particle diameter of the insulating material forming the dielectric substrate 11 is as follows. Using a field emission scanning electron microscope (FE-SEM) manufactured by JEOL Ltd., a cut surface of the dielectric substrate 11 in the thickness direction is observed, and the average of particle diameters of 200 particles of the insulating material is obtained as the average primary particle diameter using an intercept method. The cut surface of the sample is formed by cutting the sample in the thickness direction using a rotating disk-shaped grindstone. In addition, in each evaluation, the method of cutting the sample is the same.

A first gas hole 67, a second gas hole 68, and the gas flow path 60 are provided in the dielectric substrate 11. The gas flow path 60 extends along the planar direction of the placement surface 2*s*. The first gas hole 67 extends downward from the gas flow path 60. On the other hand, the second gas hole 68 extends upward from the gas flow path 60 and is opened to the placement surface 2*s*. The first gas hole 67 and the second gas hole 68 communicate with each other through the gas flow path 60. The heat transfer gas G flows through the first gas hole 67, the gas flow path 60, and the second gas hole 68.

The heat transfer gas G is, for example, a cooling gas such as He. The heat transfer gas G passes through the first gas hole 67 and flows into the gas flow path 60. The heat transfer gas G that passes through the gas flow path 60 cools the electrostatic chuck member 2. Further, the heat transfer gas G of the gas flow path 60 is supplied to the placement surface 2*s* from the second gas hole 68 to cool the wafer W mounted on the placement surface 2*s*.

The gas flow path 60 is provided between the first supporting plate 11*a* and the second supporting plate 11*b*. The first supporting plate 11*a* according to present embodiment has a first facing surface 12*a* facing the second supporting plate 11*b* side (that is, the upper side). Similarly, the second supporting plate 11*b* has a second facing surface 12*b* facing the first supporting plate 11*a* side (that is, the lower side). The first facing surface 12*a* and the second facing surface 12*b* face each other with the joining layer 11*d* therebetween. In the second facing surface 12*b*, a recessed groove 60A covered with the first facing surface 12*a* is provided. The gas flow path 60 is formed in a space surrounded by the recessed groove 60A and the first facing surface 12*a*.

In the present embodiment, the case where the recessed groove 60A is provided in the second facing surface 12*b* of the second supporting plate 11*b* is described. However, the recessed groove 60A may be provided in the first facing surface 12*a* of the first supporting plate 11*a*, or the recessed groove 60A may be provided to overlap both the first facing surface 12*a* and the second facing surface 12*b*. That is, the gas flow path 60 may be formed by the recessed groove between the first supporting plate 11*a* and the second supporting plate 11*b* where the recessed groove is formed in at least one of surfaces facing each other and is covered with another one of the surfaces.

In addition, the dielectric substrate 11 according to the present embodiment is configured by stacking a plurality of supporting plates in the thickness direction, and is disposed between supporting plates different from those of the adsorption electrodes 13 and the gas flow path 60. However, the adsorption electrode 13 and the gas flow path 60 may be disposed between the same supporting plates. That is, the adsorption electrode 13 and the gas flow path 60 may be disposed between the first supporting plate 11*a* and the second supporting plate 11*b*.

Figure 2:
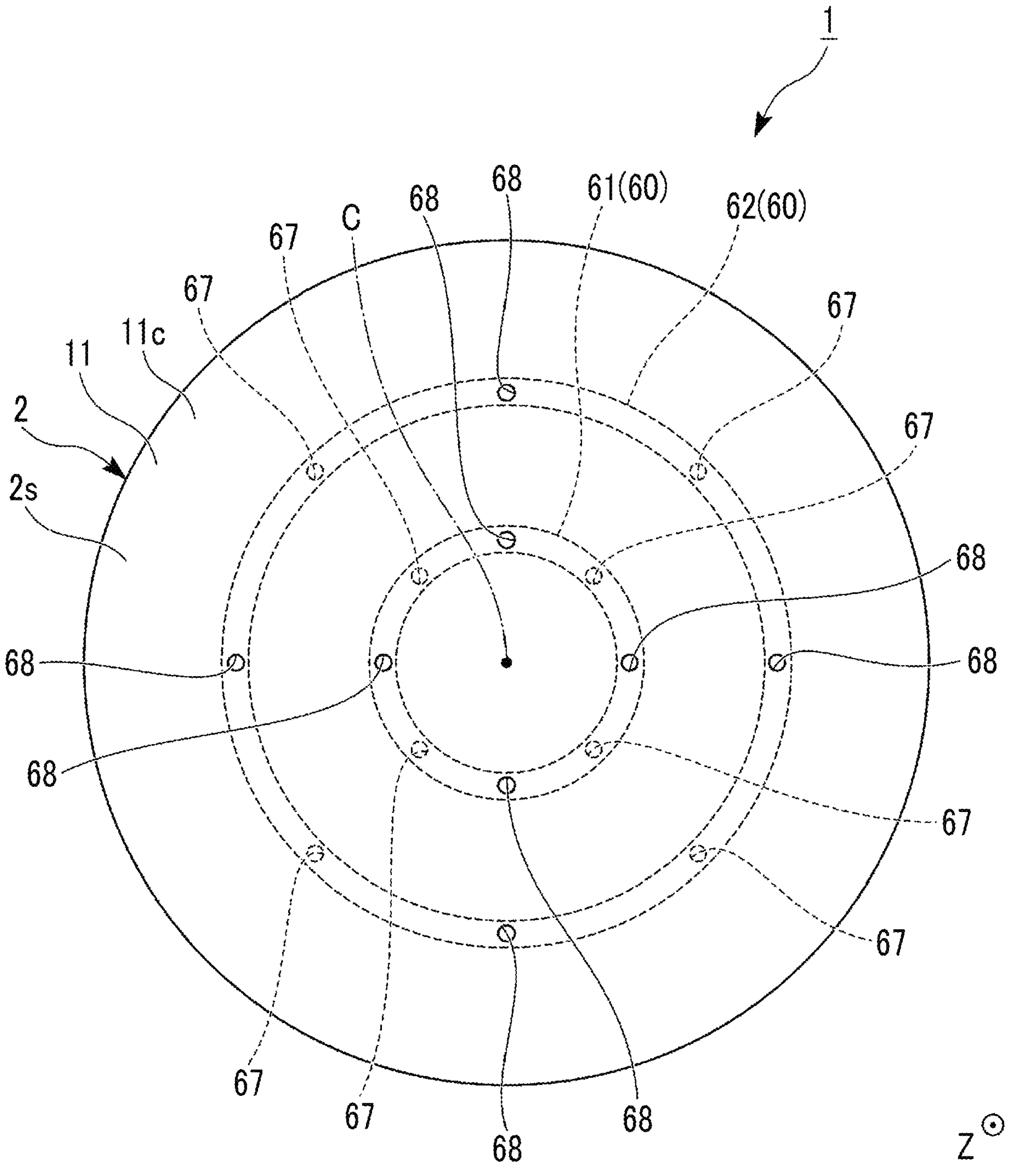
FIG. 2 is a schematic plan view illustrating the electrostatic chuck member 2.

FIG. 2 is a schematic plan view illustrating an example of the electrostatic chuck member 2.

The gas flow path 60 according to the present embodiment extends annularly about the central axis C of the electrostatic chuck member 2. Two gas flow paths 60 are provided in the dielectric substrate 11 according to the present embodiment. Each of the plurality of gas flow paths 60 include an inner peripheral flow path 61 and an outer peripheral flow path 62 that are concentrically disposed.

The plurality of first gas holes 67 are disposed at regular intervals along the peripheral direction. Similarly, the plurality of second gas holes 68 are disposed at regular intervals along the peripheral direction. The first gas hole 67 and the second gas hole 68 are alternately disposed in the peripheral direction in a path of one gas flow path 60.

As illustrated in FIG. 1, a cross-section of the gas flow path 60 according to the present embodiment has a trapezoidal shape or a substantially trapezoidal shape. An inner surface of the gas flow path 60 includes a bottom surface portion 60*a*, a top surface portion 60*b*, and a pair of side surface portions 60*c* and 60*d*. As described above, in a cross section passing through the central axis C, the top surface portion 60*b*, the bottom surface portion 60*a*, and the side surface portions 60*c* and 60*d* form the trapezoidal shape or the substantially trapezoidal shape, and a side formed by the bottom surface portion 60*a* is longer than a side formed by the top surface portion 60*b*. In the present example, a side formed by the side surface portion 60*d* is longer than a side formed by the side surface portion 60*c*.

The bottom surface portion 60*a* and the top surface portion 60*b* are flat surfaces extending substantially in parallel to the placement surface 2*s*. The bottom surface portion 60*a* faces the same direction (upper side) as the placement surface 2*s*. The top surface portion 60*b* faces a direction (lower side) opposite to the placement surface 2*s*. The top surface portion 60*b* faces the bottom surface portion 60*a*. The bottom surface portion 60*a* is provided on the first supporting plate 11*a*. The top surface portion 60*b* is provided on the second supporting plate 11*b*.

The pair of side surface portions 60*c* and 60*d* connect the bottom surface portion 60*a* and the top surface portion 60*b* to each other. The side surface portions 60*c* and 60*d* are provided over the second supporting plate 11*b* and the joining layer 11*d*. That is, at least a part of the side surface portions 60*c* and 60*d* is provided on the joining layer 11*d*.

In the present embodiment, a width dimension L of the recessed groove 60A forming the gas flow path 60 increases toward the opening side. Accordingly, the pair of side surface portions 60*c* and 60*d* according to the present embodiment are separated from each other toward the opening side.

A height dimension D (a dimension along the thickness direction and a distance dimension between the bottom surface portion 60*a* and the top surface portion 60*b*) of the gas flow path 60 is preferably 90 μm or more and 300 μm or less. The height dimension D may be 110 μm or more and 250 μm or less, 130 μm or more and 200 μm or less, or the like. When the height dimension D of the gas flow path 60 is less than 90 μm, it is difficult to cause water or a cleaning liquid to flow into the gas flow path 60 during cleaning for remove particles remaining in the gas flow path 60 after forming the gas flow path 60. Therefore, there is a concern that the particles may be jetted to the wafer W side when the heat transfer gas G flows through the gas flow path 60. Therefore, the height dimension D of the gas flow path 60 is preferably 90 μm or more. In addition, when the height dimension D of the gas flow path 60 is more than 300 μm, the gas flow path 60 functions as a heat insulating layer, and there is a concern that temperature uniformity of the placement surface 2*s* of the electrostatic chuck member 2 may not be easily maintained. Therefore, the height dimension D of the gas flow path 60 is preferably 300 μm or less.

In each of the gas flow paths, the height dimension D may be maintained at a fixed value or a substantially fixed value. In addition, in each of the gas flow paths, a cross-sectional shape may be maintained in a fixed shape or a substantially fixed shape.

In the present embodiment, the first supporting plate 11*a* and the second supporting plate 11*b* are joined to each other through the joining layer 11*d*. Therefore, the height dimension D of the gas flow path 60 is the sum of a thickness dimension d2 of the joining layer 11*d* and a depth dimension d1 of the recessed groove 60A. In the present embodiment, the height dimension D of the gas flow path 60 can be ensured by the thickness dimension d2 of the joining layer 11*d* and the depth dimension d1 of the recessed groove 60A, and thus a cross-sectional area of the gas flow path 60 is likely to be ensured.

In the present embodiment, the thickness dimension d2 of the joining layer 11*d* is more preferably 5 μm or more and 30 μm or less, and still more preferably 7 μm or more and 20 μm or less. The thickness dimension d2 may be 6 μm or more and 25 μm or less, 10 μm or more and 20 μm or less, or the like. When the thickness dimension d2 of the joining layer 11*d* is excessively large, it is difficult to ensure the uniformity of the film thickness during the formation of the joining layer 11*d*, and there is a concern that the height dimension D of the gas flow path 60 may become unstable such that the cooling effect by the heat transfer gas G is non-uniform. In addition, when the thickness dimension d2 of the joining layer 11*d* is excessively large, in a case where the first supporting plate 11*a* and the second supporting plate 11*b* are stacked and pressurized, there is a concern that a part of the joining layer 11*d* may be deformed and penetrate into the gas flow path 60 side and the gas flow path 60 may be embedded therein. Therefore, the thickness dimension d2 of the joining layer 11*d* is preferably 5 μm or more and 30 μm or less.

The bottom surface portion 60*a* and the top surface portion 60*b* of the gas flow path 60 may be deformed to another side in a case where the first supporting plate 11*a* and the second supporting plate 11*b* are stacked and pressurized. In this case, the height dimension D of the gas flow path 60 is the smallest at the center of the gas flow path 60 in the width direction. The height dimension D of the gas flow path 60 in the present specification is a dimension of the largest portion even when the height dimension D of the gas flow path 60 changes along the width direction.

A width dimension L of the gas flow path 60 is preferably 500 μm or more and less than 3000 μm. The width dimension L may be 800 μm or more and 2500 μm or less, 1,000 μm or more and 2000 μm or less, or 1300 μm or more and 1700 μm or less. When the width dimension L of the gas flow path 60 is less than 500 μm, it is difficult to allow water or a cleaning liquid to flow into the gas flow path 60. Therefore, the width dimension L of the gas flow path 60 is preferably 500 μm or more. In addition, when the width dimension L of the gas flow path 60 is 3000 μm or more, the deformation of the bottom surface portion 60*a* and the top surface portion 60*b* occurring when the first supporting plate 11*a* and the second supporting plate 11*b* are stacked and pressurized, is significant, and there is a concern that the cross-sectional area of the gas flow path 60 may be significantly reduced. Therefore, the width dimension L of the gas flow path 60 is preferably less than 3000 μm.

In the gas flow path 60 according to the present embodiment, the width dimension L increases from the top surface portion 60*b* toward the bottom surface portion 60*a*. The width dimension L of the gas flow path 60 in the present specification is a dimension of the largest portion even when the width dimension L of the gas flow path 60 changes along the height direction. Accordingly, the width dimension L of the present embodiment is a dimension of the bottom surface portion 60*a* in the width direction.

Among the pair of side surface portions 60*c* and 60*d*, one side surface portion is an inner peripheral side surface portion 60*c* disposed on an inner peripheral side of the gas flow path 60, and another side surface portion is an outer peripheral side surface portion 60*d* disposed on an outer peripheral side. Accordingly, the inner peripheral side surface portion 60*c* faces a radially outside of the central axis C, and the outer peripheral side surface portion 60*d* faces a radially inside of the central axis C. Both the inner peripheral side surface portion 60*c* and the outer peripheral side surface portion 60*d* are inclined with respect to the thickness direction. Accordingly, the inner peripheral side surface portion 60*c* and the outer peripheral side surface portion 60*d* are conical surfaces around the central axis C of the electrostatic chuck member 2.

By inclining the inner peripheral side surface portion 60*c* with respect to the thickness direction, the height dimension D of the gas flow path 60 gradually decreases from a start point of the inclination toward the radially inside of the electrostatic chuck member 2. Therefore, the cooling effect of the heat transfer gas G flowing through the gas flow path 60 is gradually weakened from the center of the gas flow path 60 toward the radially inside of the electrostatic chuck member 2. Similarly, by inclining the outer peripheral side surface portion 60*d* with respect to the thickness direction, the height dimension D of the gas flow path 60 gradually decreases from a start point of the inclination toward the radially outside of the electrostatic chuck member 2. Therefore, the cooling effect of the heat transfer gas G flowing through the gas flow path 60 is gradually weakened from the center of the gas flow path 60 toward the radially outside of the electrostatic chuck member 2. In the present embodiment, the cooling efficiency by the heat transfer gas G can be gradually weakened at a boundary between a region where the gas flow path 60 is provided and a region where the gas flow path 60 is not provided. Therefore, a steep temperature gradient is not likely to be generated at the boundary between the region where the gas flow path 60 is provided and the region where the gas flow path 60 is not provided. As a result, non-uniformity in the temperature distribution of the wafer W mounted on the placement surface 2*s* can be suppressed.

In the present embodiment, the gas flow path 60 extends in an annular shape in a plan view. Therefore, when the wafer W has a disk shape, the wafer W can be cooled in an annular shape around the central axis C of the wafer W on the placement surface 2*s* on which the wafer W is mounted, and the temperature distribution of the wafer W is likely to be uniform.

As illustrated in FIG. 1, the adsorption electrode 13 is embedded in the dielectric substrate 11. The adsorption electrode 13 extends in a plate shape along the placement surface 2*s* of the dielectric substrate 11. By applying a voltage, the adsorption electrode 13 generates an electrostatic adsorption force to hold the wafer W in the placement surface 2*s* of the dielectric substrate 11.

The adsorption electrode 13 is formed of a composite of an insulating material and a conductive material. The insulating material in the adsorption electrode 13 is not particularly limited, and is preferably, for example, at least one selected from the group consisting of aluminum oxide ($Al_2O_3$), aluminum nitride (AlN), silicon nitride ($Si_3N_4$), yttrium (III) oxide ($Y_2O_3$), yttrium-aluminum-garnet (YAG), and $SmAlO_3$. The conductive material in the adsorption electrode 13 is preferably at least one selected from the group consisting of molybdenum carbide ($MO_2C$), molybdenum (Mo), tungsten carbide (WC), tungsten (W), tantalum carbide (TaC), tantalum (Ta), silicon carbide (SiC), carbon black, carbon nanotubes, and carbon nanofibers.

The feeding terminal 16 for applying a direct current voltage to the adsorption electrode 13 is connected to the adsorption electrode 13. The feeding terminal 16 extends from the adsorption electrode 13 toward the lower side. The feeding terminal 16 is inserted into a through-hole 17 for a terminal that penetrates a part of the base 3 and the dielectric substrate 11 in the thickness direction. On an outer peripheral side of the feeding terminal 16, an insulator 23 for a terminal having insulating properties is provided. That is, the feeding terminal 16 is inserted into an insertion hole 15 of the insulator 23 for a terminal. The insulator 23 for a terminal insulates the base 3 formed of a metal and the feeding terminal 16.

The feeding terminal 16 is connected to an external power supply 21. The power supply 21 applies a voltage to the adsorption electrode 13. The number, shape, and the like of the feeding terminals 16 are determined depending on the form of the adsorption electrode 13, that is, whether the adsorption electrode 13 is unipolar or bipolar.

The base 3 supports the electrostatic chuck member 2 from the lower side. The base 3 is a metal member having a disk shape in a plan view. A material forming the base 3 is not particularly limited as long as it is a metal having excellent thermal conductivity, electrical conductivity, and workability or a compound material including the metal. As the material for forming the base 3, for example, an alloy of aluminum (Al), copper (Cu), stainless steel (SUS), titanium (Ti), or the like is suitably used. The material forming the base 3 is preferably an aluminum alloy from the viewpoints of thermal conductivity, electrical conductivity, and workability. It is preferable that at least a surface of the base 3 that is exposed to a plasma undergoes an alumite treatment or is coated with a resin such as a polyimide resin. In addition, it is more preferable that the entire surface of the base 3 undergoes an alumite treatment or is coated with a resin. The base 3 undergoes an alumite treatment or is coated with a resin such that plasma resistance of the base 3 is improved and abnormal discharge is prevented. Accordingly, the plasma stability of the base 3 can be improved, and surface scratches of the base 3 can also be prevented.

The body of the base 3 has a function as an internal electrode for generating a plasma. The body of the base 3 is connected to an external high-frequency power supply 22 through a matching box (not illustrated).

The base 3 is fixed to the electrostatic chuck member 2 through an adhesive. That is, an adhesive layer 55 that bonds the electrostatic chuck member 2 and the base 3 to each other is provided between the electrostatic chuck member 2 and the base 3. A heater for heating the electrostatic chuck member 2 may be embedded in the adhesive layer 55.

In the base 3 and the adhesive layer 55, a plurality of gas introduction holes 30 that vertically penetrate these components are provided. The gas introduction hole 30 is opened to the placement surface 2*s*. The gas introduction hole 30 is connected to a gas supply device (not illustrated). The gas introduction hole 30 is connected to the first gas hole 67 of the electrostatic chuck member 2. The gas introduction hole 30 supplies the heat transfer gas G to the first gas hole 67. The gas introduction hole 30 is surrounded by a cylindrical insulator 24. An outer peripheral surface of the insulator 24 is fixed to the base 3 through, for example, an adhesive.

Next, a preferable example of a method for manufacturing the electrostatic chuck member 2 according to the present embodiment will be described. The method for manufacturing the electrostatic chuck member 2 according to the present embodiment includes a supporting plate preparation step, a first joining step, a second joining step, a gas hole forming step, and a terminal connection step.

The supporting plate preparation step is a step of preparing the first supporting plate 11*a*, the second supporting plate 11*b*, and the third supporting plate 11*c*. In the following description, it is assumed that a material forming the first supporting plate 11*a*, the second supporting plate 11*b*, and the third supporting plate 11*c* are an aluminum oxide-silicon carbide ($Al_2O_3$—SiC) composite sintered body.

In the supporting plate preparation step, mixed powder including silicon carbide powder and aluminum oxide powder is formed into a desired shape, and subsequently is calcinated under freely selected conditions, for example, a temperature of 1600° C. to 2000° C. in a non-oxidative atmosphere, preferably, an inert atmosphere for a predetermined time. As a result, the first supporting plate 11*a*, the second supporting plate 11*b*, and the third supporting plate 11*c* can be obtained.

The first joining step is a step of joining the first supporting plate 11*a* and the second supporting plate 11*b* to each other and forming the gas flow path 60 between the supporting plates. As a preliminary step of the first joining step, surfaces of the first supporting plate 11*a* and the second supporting plate 11*b* that are joined to each other are polished. A gas flow path forming step includes a recessed groove forming step, an application step, and a joining step. That is, the method for manufacturing the electrostatic chuck member 2 includes a recessed groove forming step, an application step, and a joining step.

Figure 3:
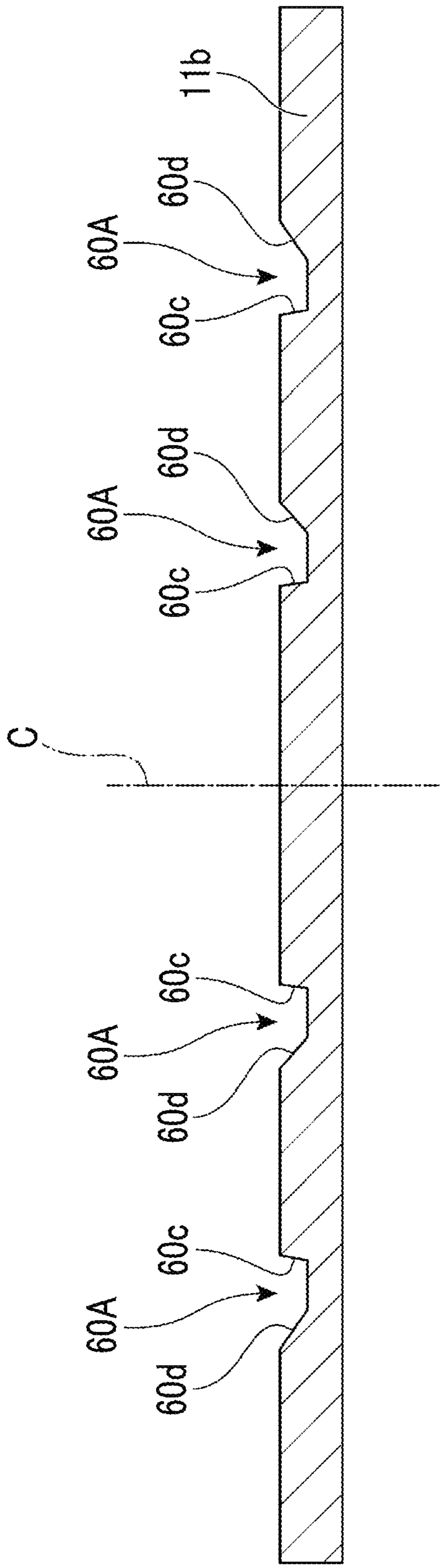
FIG. 3 is a schematic view illustrating a recessed groove forming step in a method for manufacturing the electrostatic chuck member according to the embodiment of the present invention.

As illustrated in FIG. 3, in the recessed groove forming step, a recessed groove 60A is formed in the second supporting plate 11*b*. The recessed groove 60A can be formed by blasting or rotary processing. The rotary processing is a processing method in which, while rotating the second supporting plate 11*b* to be processed around the central axis C, a tool is pressed against the processed surface to process the recessed groove 60A. When the rotary processing is adopted, the recessed groove 60A having a stable shape can be formed within a short period of time, and the electrostatic chuck member 2 can be manufactured at a low cost. In addition, in the rotary processing, for example, by gradually separating the tool from the processed surface during the processing of the recessed groove 60A, the inclined side surface portions 60*c* and 60*d* can be easily formed. In a specific example, during the processing of the recessed groove 60A, the bottom surface of the recessed groove is formed with the tool, and then the tool is gradually separated toward the outside and/or the inside from the processed surface to gradually change the processing depth. As a result, the side surface portions 60*c* and 60*d* can be formed. Alternatively, a desired recessed groove can be formed by combining a step of gradually changing the processing depth from the inside toward the outside and/or from the outside toward the inside and/or a step of maintaining a fixed depth. On the other hand, when the blasting process is adopted, the depth dimension d1 of the recessed groove 60A can be precisely controlled, and the gas flow path 60 having a stable height dimension D is likely to be formed.

In the present embodiment, the case where the recessed groove 60A is formed only in the second supporting plate 11*b* is described. However, the recessed groove 60A may be formed in only the first supporting plate 11*a*, or may be formed in each of the first supporting plate 11*a* and the second supporting plate 11*b*. That is, the recessed groove forming step may be a step of providing the recessed groove 60A in at least one of the first supporting plate 11*a* or the second supporting plate 11*b*. When the recessed groove 60A is formed in each of the first supporting plate 11*a* and the second supporting plate 11*b*, the recessed grooves 60A of the first supporting plate 11*a* and the second supporting plate 11*b* overlap each other when seen from the thickness direction. When this configuration is adopted, the dimension of the gas flow path 60 to be formed in the height direction D is likely to increase.

Figure 4:
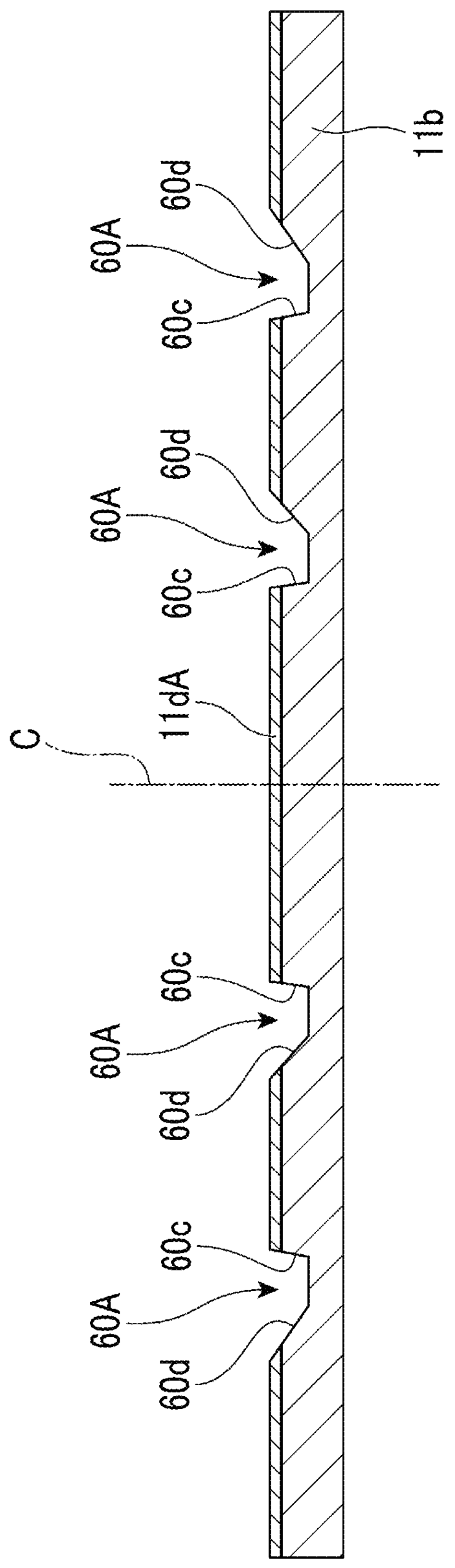
FIG. 4 is a schematic view illustrating an application step in the method for manufacturing the electrostatic chuck member according to the embodiment of the present invention.

In the application step illustrated in FIG. 4, first, a joining layer paste 11*d*A including a powder material having the same composition as or the same main component as the first supporting plate 11*a* and the second supporting plate 11*b* is prepared. Next, in the second supporting plate 11*b*, the joining layer paste 11*d*A is applied to a portion other than the recessed groove 60A on the surface where the recessed groove 60A is formed. In the present embodiment, the case where the joining layer paste 11*d*A is applied to the second supporting plate 11*b* is described. However, the joining layer paste 11*d*A may be applied to the first supporting plate 11*a*. That is, the application step may be a step of applying the joining layer paste 11*d*A to at least one of the first supporting plate 11*a* or the second supporting plate 11*b*.

Figure 5:
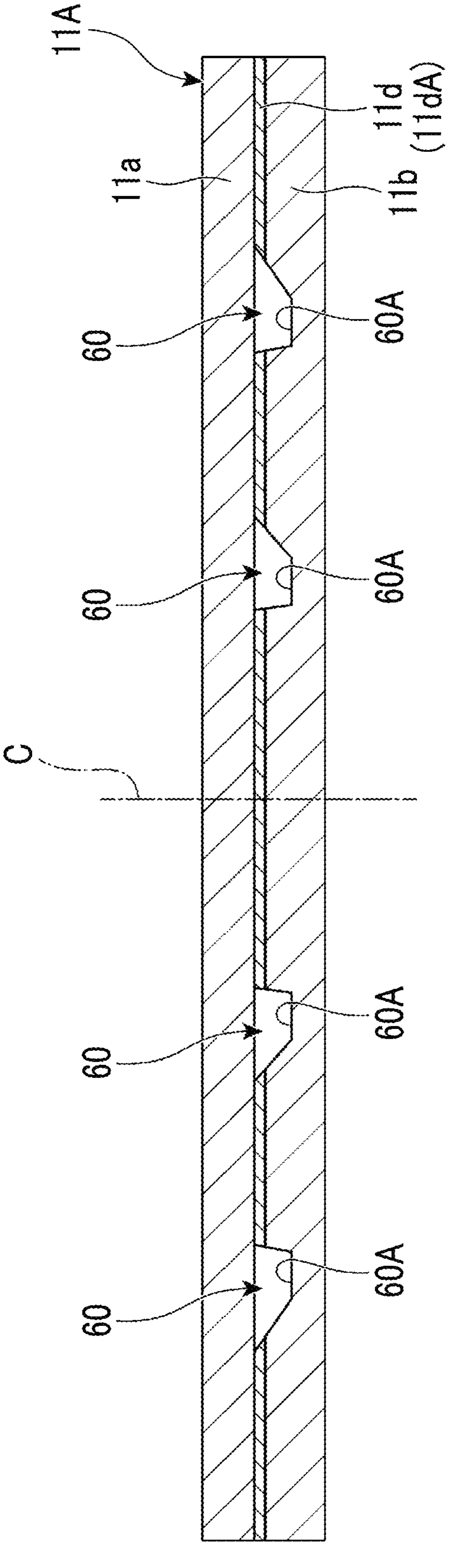
FIG. 5 is a schematic view illustrating a joining step in the method for manufacturing the electrostatic chuck member according to the embodiment of the present invention.

In the joining step illustrated in FIG. 5, the first supporting plate 11*a* and the second supporting plate 11*b* are stacked in the thickness direction through the joining layer paste 11*d*A and are hot-pressed, for example, under a high temperature and a high pressure to integrate the first supporting plate 11*a* and the second supporting plate 11*b*. The atmosphere during the hot-press can be freely selected, but a vacuum or an inert atmosphere such as Ar, He, or $N_2$ is preferable. In addition, the pressure is preferably 1 MPa to 50 MPa and more preferably 5 MPa to 20 MPa. The heat treatment temperature is preferably 1600° C. to 1900° C. and more preferably 1650° C. to 1850° C.

The joining layer paste 11*d*A is calcinated and solidified by the hot-press of the joining step to form the joining layer 11*d*, and the first supporting plate 11*a* and the second supporting plate 11*b* are joined and integrated through the joining layer 11*d*. In the following description, the joined body of the first supporting plate 11*a* and the second supporting plate 11*b* that are joined and integrated to each other by the first joining step is referred to as a joined supporting plate 11A.

By setting the heat treatment temperature in the joining step to be 1700° C. or higher, the particle diameter of the insulating material (for example, aluminum oxide) in the joining layer 11*d* calcinated in the joining step was sufficiently increased, the average primary particle diameter can be made to be 1.6 μm or more, and the voltage endurance of the joining layer 11*d* can be sufficiently ensured. The heat treatment temperature in the joining step is 1700° C. or higher, and may be, for example, 1700° C. or higher, 1710° C. or higher, 1730° C. or higher, 1750° C. or higher, 1780° C. or higher, or 1800° C. or higher. The upper limit of the heat treatment temperature can be freely selected and may be, for example, 1850° C. or lower, 1830° C. or lower, or 1800° C. or lower. However the present invention is not limited to these examples.

In the present embodiment, the first supporting plate 11*a* and the second supporting plate 11*b* are joined to each other through the joining layer 11*d*. However, the first supporting plate 11*a* and the second supporting plate 11*b* may be directly joined to each other. In this case, it is preferable that the above-described joining step is performed after polishing the surfaces of the first supporting plate 11*a* and the second supporting plate 11*b* facing each other.

The second joining step is a step of joining the third supporting plate 11*c* and the joined supporting plate 11A to each other and forming the adsorption electrodes 13 between the supporting plates. As a preliminary step of the second joining step, surfaces of the third supporting plate 11*c* and the joined supporting plate 11A that are joined to each other are polished. In the second joining step, first, a paste of a conductive material such as a conductive ceramic is applied to one surface of any one of the third supporting plate 11*c* or the joined supporting plate 11A, and the joining layer paste is applied to a region other than a region where a coating film of the conductive material is formed. Next, the third supporting plate 11*c* and the joined supporting plate 11A are stacked with the surface to which the paste is applied interposed therebetween, and is hot-pressed and integrated, for example, at a high temperature and a high pressure. With this hot-press, the paste of the conductive material is calcinated to form the adsorption electrode 13, and the third supporting plate 11*c* and the joined supporting plate 11A are joined and integrated.

The gas hole forming step is a step of forming the first gas hole 67 and the second gas hole 68 in the joined body where the first supporting plate 11*a*, the second supporting plate 11*b*, and the third supporting plate 11*c* are joined to open the gas flow path 60 to the outside. After performing the gas hole forming step, a cleaning step is performed. In the cleaning step, water or a cleaning liquid is allowed to flow into the first gas hole 67 or the second gas hole 68 to clean away particles in the gas flow path 60.

The terminal connection step is a step of providing a through-hole in the joined body in which the first supporting plate 11*a*, the second supporting plate 11*b*, and the third supporting plate 11*c* are joined to each other, disposing the feeding terminal 16 in the through-hole, and joining the feeding terminal and the adsorption electrode 13 to each other.

The electrostatic chuck member 2 is manufactured through the above-described steps. In addition, the manufactured electrostatic chuck member 2 is mounted on the base 3 where the insulator 23 for a terminal and the insulator 24 for a flow path of the heat transfer gas G are provided to configure the electrostatic chuck device 1.

Modification Example

Figure 6:
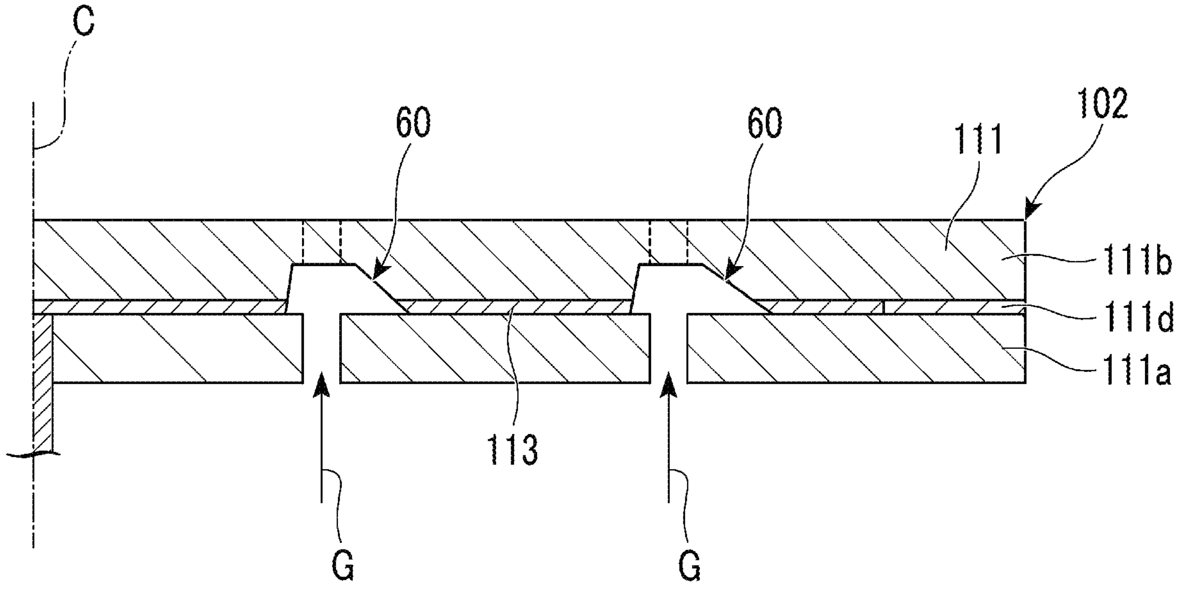
FIG. 6 is a partial schematic cross-sectional view illustrating an electrostatic chuck member according to a modification example of the present invention.

FIG. 6 is a partial schematic cross-sectional view illustrating an electrostatic chuck member 102 according to a modification example.

As in the above-described embodiment, the electrostatic chuck member 102 includes a dielectric substrate 111 and an adsorption electrode 113 that is embedded in the dielectric substrate 111. The gas flow path 60 is provided inside the dielectric substrate 111.

The dielectric substrate 111 according to the present modification example includes a first supporting plate 111*a*, a second supporting plate 111*b*, and a joining layer 111*d*. In the electrostatic chuck member 102 according to the present modification example, both the adsorption electrode 113 and the gas flow path 60 are disposed between the first supporting plate 111*a* and the second supporting plate 111*b*. That is, in the present modification example, the adsorption electrode 113 and the gas flow path 60 are disposed on the same plane. The adsorption electrode 113 is exposed to the gas flow path 60. In the present modification example, the adsorption electrode 113 can be cooled by the heat transfer gas G flowing in the gas flow path 60, and the performance of the electrostatic chuck member 102 can be stabilized. In addition, the adsorption electrode 113 according to the present modification example is disposed on the same plane as the gas flow path 60, and thus can be formed between the first supporting plate 111*a* and the second supporting plate 111*b* together with the gas flow path 60. Therefore, the manufacturing method can be suppressed from being unnecessarily complicated.

EXAMPLES

Hereinafter, the present invention will be described in detail using Examples and Comparative Examples, but is not limited to the following examples. Here, in order to check the superiority of the present invention, a first test and a second test were performed.

[First Test]

As the first test, a test of checking an appropriate heat treatment temperature for forming the joining layer capable of sufficiently ensuring insulating properties was performed.

(Preparation of Sample)

Samples according to Examples 1 and 2 and Comparative Examples 1 and 2 of the first test were prepared through the following steps.

Mixed powder including 91% by mass of aluminum oxide powder and 9% by mass of silicon carbide powder was molded and sintered to prepare a pair of ceramic plates (corresponding to the first supporting plate 11*a* and the second supporting plate 11*b*) formed of an aluminum oxide-silicon carbide composite sintered body having a disk shape.

Next, surfaces of the pair of ceramic plates in contact with the joining layer 11*d* were polished such that an arithmetic average roughness (Ra) was 0.2 μm. Next, a paste for forming a conductive layer and the joining layer paste 11*d*A were applied to the polished surface of one ceramic plate using a screen printing method.

As the paste for forming a conductive layer, a paste in which aluminum oxide powder and molybdenum carbide powder were dispersed in isopropyl alcohol was used. In the paste for forming a conductive layer, the content of the aluminum oxide powder was 25% by mass, and the content of the molybdenum carbide powder was 25% by mass.

As the joining layer paste 11*d*A, a paste in which aluminum oxide powder having an average primary particle diameter of 2.0 μm was dispersed in isopropyl alcohol was used. The content of the aluminum oxide powder in the joining layer paste 11*d*A was 50% by mass.

Next, the pair of ceramic plates were stacked in a thickness direction by causing the polished surfaces of the pair of ceramic plates to face each other through the paste for forming a conductive layer and the joining layer paste 11*d*A. Next, a joining step of joining and integrating the stacked body by pressurizing the stacked body in the thickness direction while heating the stacked body in an argon atmosphere was performed. Through the joining step, the joining layer paste 11*d*A was calcinated, and the joining layer 11*d* was formed. In the joining step, the welding pressure was 10 MPa, and the time for which the heat treatment and the pressurization were performed was 2 hours.

The heat treatment temperatures in the joining step of the samples of Examples 1 and 2 and Comparative Examples 1 and 2 were set to be different from each other. The heat treatment in the joining step of each of the samples is collectively shown in Table 1 below.

(Measurement of Average Primary Particle Diameter)

Regarding the joining layer 11*d* of each of the prepared samples, the average primary particle diameter of the insulating material ($Al_2O_3$) was measured. Regarding the average primary particle diameter of the insulating material forming the joining layer 11*d*, using a field emission scanning electron microscope (FE-SEM) manufactured by JEOL Ltd., a cut surface was observed, and the average of particle diameters of 200 particles of the insulating material was obtained as the average primary particle diameter using an intercept method. The measurement results are collectively shown in Table 1 below.

(Insulating Properties Evaluation)

Insulating properties of each of the prepared samples were evaluated. On side surfaces of the ceramic joined body of the sample (side surfaces of the ceramic joined body in the thickness direction), a carbon tape was bonded in contact with the pair of ceramic plates, the conductive layer, and the joining layer. Next, a through electrode that penetrated through one ceramic plate and reached the conductive layer in the thickness direction was formed. Further, a voltage was applied to the joined body through the carbon tape and the through electrode, and a voltage at which breakdown occurred in the joined body was measured. Specifically, an RF voltage was applied in a state where a voltage of 3000 V was applied, and this state was maintained for 10 minutes. Next, a voltage of 500 V was gradually applied, and this state was maintained for 10 minutes. When the measured current value exceeded 0.1 mA (milliampere), breakdown occurred. The measurement results are collectively shown in Table 1 below.

TABLE 1

| | Heat Treatment Temperature in Joining Step [° C.] | Average Primary Particle Diameter of Insulating Material [μm] | Insulation Withstand Voltage [kV/mm] |
|---|---|---|---|
| Example 1 | 1750 | 3.3 | 18 |
| Example 2 | 1700 | 3.0 | 9 |
| Comparative Example 1 | 1650 | 1.5 | 3.5 |
| Comparative Example 2 | 1600 | 1.0 | 0.5 |

It was verified from the results shown in Table 1 that, by setting the heat treatment temperature in the joining step to be 1700° C. or higher, the average primary particle diameter of the insulating material of the joining layer 11*d* can be increased to 1.6 μm or more, and the insulating properties of the electrostatic chuck member can be improved. The average primary particle diameter of the insulating material in the pair of ceramic plates is more than the average primary particle diameter of the insulating material of the composite layer 11*d*. The reason for this is that the particle diameter of the insulating material is more likely to increase by performing a heat treatment on the ceramic plate more times than on the composite layer 11*d*.

[Second Test]

As a second test, a test of checking the shape of the gas flow path 60 in which cleaning was able to be stably performed was performed.

(Preparation of Sample)

Samples according to Examples 3 to 9 and Comparative Examples 3 to 10 of the first test were prepared through the following steps.

Mixed powder including 91% by mass of aluminum oxide powder and 9% by mass of silicon carbide powder was molded and sintered to prepare a pair of ceramic plates (corresponding to the first supporting plate 11*a* and the second supporting plate 11*b*) formed of an aluminum oxide-silicon carbide composite sintered body having a disk shape.

Next, surfaces of the pair of ceramic plates in contact with the joining layer 11*d* were polished such that an arithmetic average roughness (Ra) was 0.2 μm. Further, in some of the samples, the recessed groove 60A was formed on the polished surface of one of the pair of ceramic plates by blasting or rotary processing. The depth dimensions d1 of the recessed grooves 60A of the samples were set to be different from each other. In each of the samples, whether or not the recessed groove 60A was formed, the method of forming the recessed groove 60A, and the depth dimension d1 of the recessed groove 60A are collectively shown in Table 2 below.

Next, the joining layer paste 11*d*A was applied to the polished surface of one ceramic plate using a screen printing method. As the joining layer paste 11*d*A, a paste in which aluminum oxide powder having an average primary particle diameter of 2.0 μm was dispersed in isopropyl alcohol was used. The content of the aluminum oxide powder in the joining layer paste 11*d*A was 50% by mass. For the samples in which the recessed groove 60A was not formed, a recessed groove having a depth corresponding to the coating thickness of the joining layer paste 11*d*A was formed using a portion where the joining layer paste 11*d*A was not provided. The coating thicknesses of the joining layer paste 11*d*A of the samples were set to be different from each other. The coating thicknesses of the joining layer paste 11*d*A are collectively shown in Table 2 below.

Next, the pair of ceramic plates were stacked in a thickness direction by causing the polished surfaces of the pair of ceramic plates to face each other through the joining layer paste 11*d*A. Next, a joining step of joining and integrating the stacked body by pressurizing the stacked body in the thickness direction while heating the stacked body in an argon atmosphere was performed. Through the joining step, the joining layer paste 11*d*A was calcinated, and the joining layer 11*d* was formed. In the joining step, the welding pressure was 10 MPa, the heat treatment temperature was 1700° C., and the time for which the heat treatment and the pressurization were performed was 2 hours. Through these steps, the gas flow path 60 formed by the recessed groove 60A and the joining layer paste 11*d*A was formed between the pair of ceramic plates. The shape of the gas flow path 60 in a plan view was substantially the same as the shape shown in FIG. 2 and was an annular shape. Next, a plurality of first gas holes 67 and a plurality of second gas holes 68 connected to the gas flow path 60 were formed. The disposition of the first gas holes 67 and the second gas holes 68 was the same as that of FIG. 2. As a result, the first gas holes 67, the gas flow path 60, and the second gas holes 68 communicated with each other.

(Measurement of Dimensions of Gas Flow Path)

The height dimension D and the width dimension L of the gas flow path 60 of each of the prepared samples were measured. Regarding the height dimension D and the width dimension L, each of the samples was cut using a well-known method, and the observed surface was polished to prepare an observation sample where the gas flow path 60 was exposed. The dimensions of each of the portions were measured by observing the portions with a microscope (digital microscope: VHX-900, manufactured by Keyence Corporation). The measurement results are collectively shown in Table 2 below. When a significant collapse occurred in the gas flow path 60 during the observation with the microscope, this sample was evaluated as x (Bad) in visual inspection, and when the shape of the gas flow path 60 was maintained, this sample was evaluated as ○ (Good) in visual inspection. In particular, in the sample according to Comparative Example 10, the collapse of the gas flow path 60 was significant. Therefore, it was difficult to measure the dimension of the gas flow path 60.

(Cleaning Test of Gas Flow Path)

Whether or not the gas flow path 60 of each of the prepared samples was able to be cleaned was evaluated. In the electrostatic chuck member 2, after forming the gas flow path 60, water was caused to flow into the gas flow path 60 to clean the gas flow path 60. When the collapse of the gas flow path 60 was significant, the cross-sectional area of the gas flow path 60 was small, it was difficult to cause pure water to flow into the gas flow path 60, and cleaning was not able to be appropriately performed. Here, the water pressure was 0.16 MPa, pure water was sprayed into the gas flow path 60 from the plurality of first gas holes 67, and a flow rate at which pure water flowed out from the second gas holes 68 was measured. The measurement results are collectively shown in Table 2 below. In the sample according to Comparative Example 10, the collapse from the center portion of the gas flow path 60 was significant in the visual inspection. Therefore, the cleaning test was not performed.

TABLE 2

| | Manufacturing Method | | Gas Flow Path | | | | | Evaluation | |
|---|---|---|---|---|---|---|---|---|---|
| | Recessed Groove Method for Forming Recessed Groove | Coating Thickness of Joining Layer Paste [μm] | Depth Dimension of Recessed Groove [μm] | Width Dimension L [μm] | Height Dimension D [μm] | Thickness Dimension d2 of Joining Layer [μm] | Depth Dimension d1 of Recessed Groove [μm] | Visual Inspection | Cleaning Test [mL/min] |
| Comparative Example 3 | None | 24 | 0 | 1000 | 12~14 | 12 | 0 | x | 0 |
| Comparative Example 4 | None | 62 | 0 | 500 | 32 | 28~32 | 0 | ○ | N.D. |
| Comparative Example 5 | None | 62 | 0 | 1000 | 28 | 28~32 | 0 | ○ | N.D. |
| Comparative Example 6 | Blasting | 20~24 | 25~30 | 500 | 32 | 12 | 20 | ○ | N.D. |
| Comparative Example 7 | Blasting | 20~24 | 25~30 | 1000 | 18 | 12 | 6 | ○ | N.D. |
| Comparative Example 8 | Blasting | 20~24 | 40~45 | 500 | 40 | 12 | 28 | ○ | N.D. |
| Comparative Example 9 | Blasting | 20~24 | 40~45 | 1000 | 42 | 12 | 30 | ○ | 0.06 |
| Example 3 | Blasting | 20~24 | 105~115 | 1000 | 99~107 | 12 | 87~95 | ○ | 3 |
| Example 4 | Blasting | 20~24 | 155~160 | 1000 | 151~162 | 12 | 139~150 | ○ | 9 |
| Example 5 | Blasting | 20~24 | 195~205 | 1000 | 189~197 | 12 | 177~185 | ○ | 18 |
| Example 6 | Rotary Processing | 20~24 | 105~110 | 1000 | 93~110 | 12 | 81~98 | ○ | 23 |
| Example 7 | Rotary Processing | 20~24 | 215~220 | 1000 | 178~205 | 12 | 166~193 | ○ | 29 |
| Example 8 | Rotary Processing | 20~24 | 313~316 | 1000 | 279~301 | 12 | 267~289 | ○ | 139 |
| Example 9 | Rotary Processing | 20~24 | 313~316 | 2000 | 229~251 | 12 | 217~239 | ○ | 226 |
| Comparative Example 10 | Rotary Processing | 24 | 315 | 3000 | Not Measurable | Not Measurable | Not Measurable | x | |

In Table 2, in a field in which numerical values specifying a range such as "A to B" are described, a numerical range of a plurality of acquired data is described.

In the results of the cleaning test of Table 2, "N. D." represents "Not Detected".

In the results of the cleaning test in Table 2, the amounts of water of Comparative Example 9 and Examples 3 to 9 are not necessarily proportional to the cross-sectional areas of the gas flow paths. The reason for this is presumed to be that the cross-sectional shape affected the flowability of water.

As shown in Table 2, it was verified that, by setting the height dimension D of the gas flow path 60 to be 90 μm or more and 300 μm or less and setting the width dimension L to be 500 μm or more, water can be caused to flow into the gas flow path 60 at a sufficient flow rate during the cleaning test, and the gas flow path 60 can be appropriately cleaned. In addition, in Comparative Example 10 in which the width dimension L of the gas flow path 60 was 3000 μm, the deformation of the bottom surface portion 60*a* or the top surface portion 60*b* of the gas flow path 60 in the joining step was significant, and the collapse of the gas flow path 60 was observed by visual inspection. As a result, it was verified that the width dimension L of the gas flow path 60 is preferably less than 3000 μm.

Hereinabove, various embodiments of the present invention has been described. However, the configurations of the embodiments, a combination thereof, and the like are exemplary, and additions, omissions, replacements and other changes can be made for the configurations within a range not departing from the scope of the present invention. Further, the present invention is not limited to the embodiments.

For example, in the embodiment and the modification example described above, the case where the electrostatic chuck member includes only one electrode (adsorption electrode) is described. However, the electrostatic chuck member may further include another electrode such as a heater electrode or a RF (Radio Frequency) electrode.

INDUSTRIAL APPLICABILITY

The present invention can provide an electrostatic chuck member where a height dimension of a gas flow path is suppressed such that non-uniformity of the temperature of the placement surface can be suppressed, an electrostatic chuck device, and a method for manufacturing the electrostatic chuck member.

REFERENCE SIGNS LIST

1: Electrostatic chuck device
2, 102: electrostatic chuck member
2*s*: placement surface
3: base
11, 111: dielectric substrate
11*a*: supporting plate
11*a*, 111*a*: first supporting plate
11*b*, 111*b*: second supporting plate
11*c*: third supporting plate
11*d*, 111*d*: joining layer
11*d*A: joining layer paste
11A: joined supporting plate
12*a*: first facing surface
12*b*: second facing surface
13, 113: adsorption electrode
15: insertion hole
16: feeding terminal
17: through-hole for terminal
21: external power supply
22: external high-frequency power supply
23: insulator for terminal
24: cylindrical insulator
30: gas introduction hole
32: through-hole
55: adhesive layer
60: gas flow path
60*a*: bottom surface portion of gas flow path
60*b*: top surface portion of gas flow path
60*c*: side surface portion
60*d*: side surface portion
60A: recessed groove
61: inner peripheral flow path
62: outer peripheral flow path
67: first gas hole
68: second gas hole
C: central axis
D: height dimension
D: height direction
d1: depth dimension
d2: thickness dimension
G: heat transfer gas
L: width dimension
W: wafer (sample)
Z: Z-axis (Z direction)
III: region

The invention claimed is:

1. An electrostatic chuck member comprising:

a dielectric substrate having a placement surface on which a sample is mounted, wherein the dielectric substrate comprises a first supporting plate and a second supporting plate which are stacked in a thickness direction thereof; and an adsorption electrode which is embedded in the dielectric substrate, wherein a gas flow path is provided with a recessed groove, which is provided between the first supporting plate and the second supporting plate which have surfaces facing each other, wherein the recessed groove is formed in at least one of the surfaces thereof and is covered with the other thereof, a dimension of the gas flow path in a height direction is 90 μm or more and 300 μm or less, and a width dimension of the gas flow path is 500 μm or more and less than 3000 μm.

2. The electrostatic chuck member according to claim 1, wherein the dielectric substrate is a composite sintered body of aluminum oxide and silicon carbide.

3. The electrostatic chuck member according to claim 2, wherein an average primary particle diameter of an insulating material forming the dielectric substrate is 1.6 μm or more and 10.0 μm or less.

4. The electrostatic chuck member according to claim 1, wherein the first supporting plate and the second supporting plate are joined to each other through a joining layer, and a height dimension of the gas flow path is a sum of a thickness dimension of the joining layer and a depth dimension of the recessed groove.

5. The electrostatic chuck member according to claim 4, wherein a cross-sectional shape of the gas flow path in a thickness direction of the dielectric substrate is maintained in a fixed shape or a substantially fixed shape, and wherein a thermal conductivity of the joining layer is higher than a thermal conductivity of each of the first supporting plate and the second supporting plate, and a ratio of a conductive material in the joining layer is higher than that in each of the first supporting plate and the second supporting plate.

6. The electrostatic chuck member according to claim 1, wherein the adsorption electrode is disposed between the first supporting plate and the second supporting plate and is exposed to the gas flow path.

7. An electrostatic chuck device comprising:

the electrostatic chuck member according to claim 1; and a base that supports the electrostatic chuck member from a side opposite to the placement surface.

8. The electrostatic chuck member according to claim 1, wherein the height direction of the gas flow path is same with the thickness direction of the dielectric substrate, the recessed groove has been formed in the surface of the second supporting plate, and the recessed groove is covered with the surface of the first supporting plate, which faces the surface of the second supporting plate.

9. The electrostatic chuck member according to claim 1, wherein a third supporting plate is provided on the second supporting plate, and the adsorption electrode is disposed between the second supporting plate and the third supporting plate.

10. The electrostatic chuck member according to claim 1, wherein a cross-section of the gas flow path in a thickness direction of the dielectric substrate has a trapezoidal shape or a substantially trapezoidal shape.

11. The electrostatic chuck member according to claim 1, wherein the gas flow path extends in an annular shape in a plan view of the dielectric substrate.

12. The electrostatic chuck member according to claim 1, wherein the gas flow path includes an inner peripheral flow path and an outer peripheral flow path, which are concentrically disposed around a central axis of the dielectric substrate.

13. The electrostatic chuck member according to claim 1, wherein:

one of the surfaces facing each other of the first supporting plate and the second supporting plate is a flat surface, the gas flow path has an annular shape in a plan view, and the gas flow path includes an inner bottom surface, an inner top surface, and two inner side surfaces, the inner top surface is formed by a part of the flat surface, the inner side surfaces include an inner side surface and an outer side surface disposed on an outer peripheral side, the bottom surface connects the inner side surface and the outer side surface, and the side surfaces face each other, and at least one of the side surfaces is inclined with respect to thickness direction of the dielectric substrate.

14. The electrostatic chuck member according to claim 13, wherein the side surfaces are inclined with respect to the thickness direction.

15. The electrostatic chuck member according to claim 1, wherein:

the gas flow path includes an inner bottom surface, an inner top surface, and two inner side surfaces, the bottom surface faces the top surface and they are parallel to each other or they are substantially parallel to each other, and the inner side surfaces face each other, and wherein in a cross section in the thickness direction passing through a central axis of the dielectric substrate, the top surface, the bottom surface, and the side surfaces form trapezoidal shape or substantially trapezoidal shape.

16. The electrostatic chuck member according to claim 15, wherein, in the trapezoidal shape or substantially trapezoidal shape, length of a side formed by one of the side surfaces, which is closer to the central axis, is smaller than length of a side formed by the other of the side surfaces.

17. A method for manufacturing an electrostatic chuck member which includes a dielectric substrate, which includes a first supporting plate, a second supporting plate, and a joining layer disposed between the first supporting plate and the second supporting plate, and an adsorption electrode embedded in the dielectric substrate, the method comprising:

a recessed groove forming step of forming a recessed groove in the first supporting plate;

an application step of applying a joining layer paste to at least one of the first supporting plate and the second supporting plate; and a joining step of stacking the first supporting plate and the second supporting plate in a thickness direction thereof through the joining layer paste, and joining the first supporting plate and the second supporting plate by heating and pressurizing them, wherein a heat treatment temperature in the joining step is 1700° C. or higher.

18. The method for manufacturing an electrostatic chuck member according to claim 17, wherein in the joining step, a surface of the first supporting plate where the recessed groove is formed and a surface of the second supporting plate are joined to each other through the joining layer paste, the recessed groove has an arc shape in a plan view, and the recessed groove includes an inner peripheral side surface portion disposed on an arc inner peripheral side, an outer peripheral side surface portion disposed on an arc outer peripheral side, and a bottom surface portion connecting side surface portions, wherein the side surface portions, which face each other, are inclined with respect to the thickness direction of the supporting plates.

19. The method for manufacturing an electrostatic chuck member according to claim 17, wherein a material forming the first supporting plate, and the second supporting plate is an aluminum oxide-silicon carbide composite sintered body.

20. The method for manufacturing an electrostatic chuck member according to claim 17, wherein the recessed groove forming step is performed by blasting or rotary processing.

* * * * *